United States Patent
Park et al.

(10) Patent No.: US 9,768,141 B2
(45) Date of Patent: Sep. 19, 2017

(54) REMOVAL APPARATUSES FOR SEMICONDUCTOR CHIPS

(71) Applicant: Samsung Electronics Co., Ltd., Suwon-si, Gyeonggi-do (KR)

(72) Inventors: JaeYong Park, Cheonan-si (KR); Junyoung Ko, Cheonan-si (KR); Whasu Sin, Cheonan-si (KR); Kyhyun Jung, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 181 days.

(21) Appl. No.: 14/632,657

(22) Filed: Feb. 26, 2015

(65) Prior Publication Data

US 2015/0179601 A1 Jun. 25, 2015

Related U.S. Application Data

(62) Division of application No. 13/527,777, filed on Jun. 20, 2012, now Pat. No. 8,998,068.

(30) Foreign Application Priority Data

Jul. 6, 2011 (KR) .......................... 10-2011-0066942

(51) Int. Cl.
*B23K 1/018* (2006.01)
*H01L 23/00* (2006.01)
(Continued)

(52) U.S. Cl.
CPC .......... *H01L 24/799* (2013.01); *B23K 1/0016* (2013.01); *B23K 1/0056* (2013.01);
(Continued)

(58) Field of Classification Search
CPC ..... H01L 2224/131; H01L 2924/12042; H01L 2924/00; H01L 2924/014; H01L 2224/16225; H01L 2224/16227
See application file for complete search history.

(56) References Cited

U.S. PATENT DOCUMENTS 4,877,175 A 10/1989 Jones et al.
5,140,128 A * 8/1992 Jones ..................... B23K 26/40
219/121.72

(Continued)

FOREIGN PATENT DOCUMENTS

JP 56-002646 H 1/1981
JP 02-224869 H 9/1990
(Continued)

*Primary Examiner* — Minh Trinh
(74) *Attorney, Agent, or Firm* — Harness, Dickey & Pierce, P.L.C.

(57) ABSTRACT

An apparatus for removing a semiconductor chip from a board may include: a laser configured to irradiate the board with a laser beam to heat bumps mounting the semiconductor chip on the board; a picker configured to separate the semiconductor chip from the board; a vacuum portion configured to provide a vacuum to the picker; and an intake. If solder pillars, that are residues of the bumps, are melted by the laser beam, the intake removes the solder pillars using the vacuum provided from the vacuum portion. An apparatus for removing a semiconductor chip from a board may include: a stage configured to support the board on which the semiconductor chip is mounted by bumps; a laser configured to irradiate the board with a laser beam to heat the bumps mounting the semiconductor chip on the board; and a picker configured to separate the semiconductor chip from the board.

6 Claims, 5 Drawing Sheets

(51) Int. Cl.
  *B23K 1/00* (2006.01)
  *B23K 1/005* (2006.01)
  *H05K 13/04* (2006.01)
  *B23K 26/38* (2014.01)
  *B23K 101/42* (2006.01)

(52) U.S. Cl.
  CPC .............. *B23K 1/018* (2013.01); *B23K 26/38* (2013.01); *H01L 24/98* (2013.01); *H05K 13/0486* (2013.01); *B23K 2201/42* (2013.01); *H01L 2224/131* (2013.01); *H01L 2224/16225* (2013.01); *H01L 2224/16227* (2013.01); *H01L 2924/12042* (2013.01); *Y10T 29/49821* (2015.01); *Y10T 29/53274* (2015.01)

(56) References Cited

U.S. PATENT DOCUMENTS

| | | | | |
|---|---|---|---|---|
| 5,909,838 | A * | 6/1999 | Jimarez | B23K 1/018 228/125 |
| 5,923,796 | A | 7/1999 | Feldman et al. | |
| 5,977,512 | A * | 11/1999 | Azdasht | B23K 1/0056 219/121.63 |
| 6,278,078 | B1 * | 8/2001 | Walvoord | B23K 1/0056 219/121.61 |
| 6,353,202 | B1 * | 3/2002 | Grotsch | H01L 24/83 219/121.63 |
| 6,435,401 | B1 | 8/2002 | Miitsu et al. | |
| 6,857,183 | B2 | 2/2005 | Farnworth et al. | |
| 7,464,850 | B2 | 12/2008 | Kim | |
| 7,682,970 | B2 | 3/2010 | Grigoropoulos et al. | |
| 8,290,239 | B2 * | 10/2012 | Noy | H05K 3/225 382/141 |
| 8,998,068 | B2 * | 4/2015 | Park | B23K 1/0016 219/121.63 |
| 2003/0179800 | A1 | 9/2003 | Uebbing | |
| 2008/0113460 | A1 | 5/2008 | Shelton et al. | |
| 2009/0035891 | A1 | 2/2009 | Kim | |
| 2009/0090468 | A1 * | 4/2009 | Murayama | B23K 1/0056 156/350 |
| 2009/0101929 | A1 | 4/2009 | Mo et al. | |
| 2013/0008020 | A1 | 1/2013 | Park et al. | |

FOREIGN PATENT DOCUMENTS

| | | |
|---|---|---|
| JP | 09-330956 H | 12/1997 |
| JP | 2001-036232 A | 2/2001 |
| JP | 2001-148403 A | 5/2001 |
| JP | 2002-289732 A | 10/2002 |
| JP | 2005-005460 A | 1/2005 |
| JP | 2010-278248 A | 12/2010 |
| KR | 10-0370521 B1 | 1/2003 |
| KR | 20050123395 A | 12/2005 |
| KR | 20100116944 A | 11/2010 |
| KR | 20110038292 A | 4/2011 |

* cited by examiner

REMOVAL APPARATUSES FOR SEMICONDUCTOR CHIPS

CROSS-REFERENCE TO RELATED APPLICATION(S)

This application is a divisional application of U.S. patent application Ser. No. 13/527,777, entitled "REMOVAL APPARATUSES FOR SEMICONDUCTOR CHIPS" and filed on Jun. 20, 2012, and claims the associated benefit under 35 U.S.C. §121. Parent U.S. patent application Ser. No. 13/527,777 claimed priority from Korean Patent Application No. 10-2011-0066942, filed on Jul. 6, 2011, in the Korean Intellectual Property Office (KIPO). The entire contents of parent U.S. patent application Ser. No. 13/527,777 and priority Korean Patent Application No. 10-2011-0066942 are incorporated herein by reference.

BACKGROUND

Example embodiments relate to semiconductor manufacturing apparatuses and/or methods of manufacturing semiconductors. Example embodiments may relate to an apparatuses for removing failed semiconductor chips from boards and/or methods of removing failed semiconductor chips from boards.

Recently, the demand for a board manufactured by a flip chip method among printed circuit boards (PCB) is increasingly growing. The board manufactured by a flip chip method is a board of which a functional characteristic and an electrical characteristic are improved by connecting a semiconductor chip and a board with a solder bump replacing an existing wire. The board manufactured by a flip chip method may be shipped after goods pass the installation test which is one of module processes. The goods which failed to pass the installation test may be repaired after a failed semiconductor chip is removed from the board. However, a conventional technique of removing a failed semiconductor chip is not standardized and depends on a manual labor of an engineer.

SUMMARY

Example embodiments may provide removal apparatuses for semiconductor chips. Example embodiments also may provide methods of removing semiconductor chips from boards.

In some example embodiments, a removal apparatus for a semiconductor chip may include a stage configured to support a board on which the semiconductor chip is mounted by bumps, a laser configured to irradiate a laser beam into the board over an area larger than the semiconductor chip, and/or a picker configured to cause the laser beam to penetrate the semiconductor chip locally and to separate the semiconductor chip from the board.

In some example embodiments, the picker may include a lens configured to focus the laser beam on the semiconductor chip.

In some example embodiments, the removal apparatus may further include a vacuum portion configured to provide a vacuum to the picker.

In some example embodiments, the picker may further define an open hole configured to draw the semiconductor chip using the vacuum provided from the vacuum portion and/or to cause the laser beam focused by the lens to penetrate the semiconductor chip.

In some example embodiments, the picker may further define an open hole configured to draw the semiconductor chip using the vacuum provided from the vacuum portion and/or to cause the laser beam focused by the lens to penetrate the semiconductor chip.

In some example embodiments, the removal apparatus may further include a drive portion configured to move the picker and the intake around the stage.

In some example embodiments, the removal apparatus may further include an air knife configured to blow high temperature air on the solder pillars.

In some example embodiments, the removal apparatus may further include a coining plate configured to compress the solder pillars.

In some example embodiments, the removal apparatus may further include a nozzle configured to spray flux on the solder pillars.

In some example embodiments, the removal apparatus may further include a loader configured to load the board on the stage and/or an unloader configured to unload the board from the stage.

In some example embodiments, the removal apparatus may further include a semiconductor chip recognition portion configured to recognize the semiconductor chip on the board.

In some example embodiments, an apparatus for removing a semiconductor chip from a board may include a laser configured to irradiate the board with a laser beam to heat bumps mounting the semiconductor chip on the board and/or a picker configured to separate the semiconductor chip from the board.

In some example embodiments, the laser beam may be configured to irradiate the board over a first area of the board that is larger than the semiconductor chip.

In some example embodiments, the apparatus may further include a vacuum portion configured to provide a vacuum to the picker.

In some example embodiments, the picker may define an open hole configured to draw the semiconductor chip using the vacuum provided from the vacuum portion.

In some example embodiments, the picker may include a lens configured to focus the laser beam on the semiconductor chip.

In some example embodiments, the lens may be configured to focus the laser beam on a second area of the board that is smaller than the semiconductor chip.

In some example embodiments, the lens may be configured to focus the laser beam to heat the bumps mounting the semiconductor chip on the board.

In some example embodiments, the apparatus may further include a vacuum portion configured to provide a vacuum to the picker.

In some example embodiments, the picker may further define an open hole drawing the semiconductor chip using the vacuum provided from the vacuum portion and/or the lens may be configured to focus the laser beam to heat the bumps mounting the semiconductor chip on the board.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
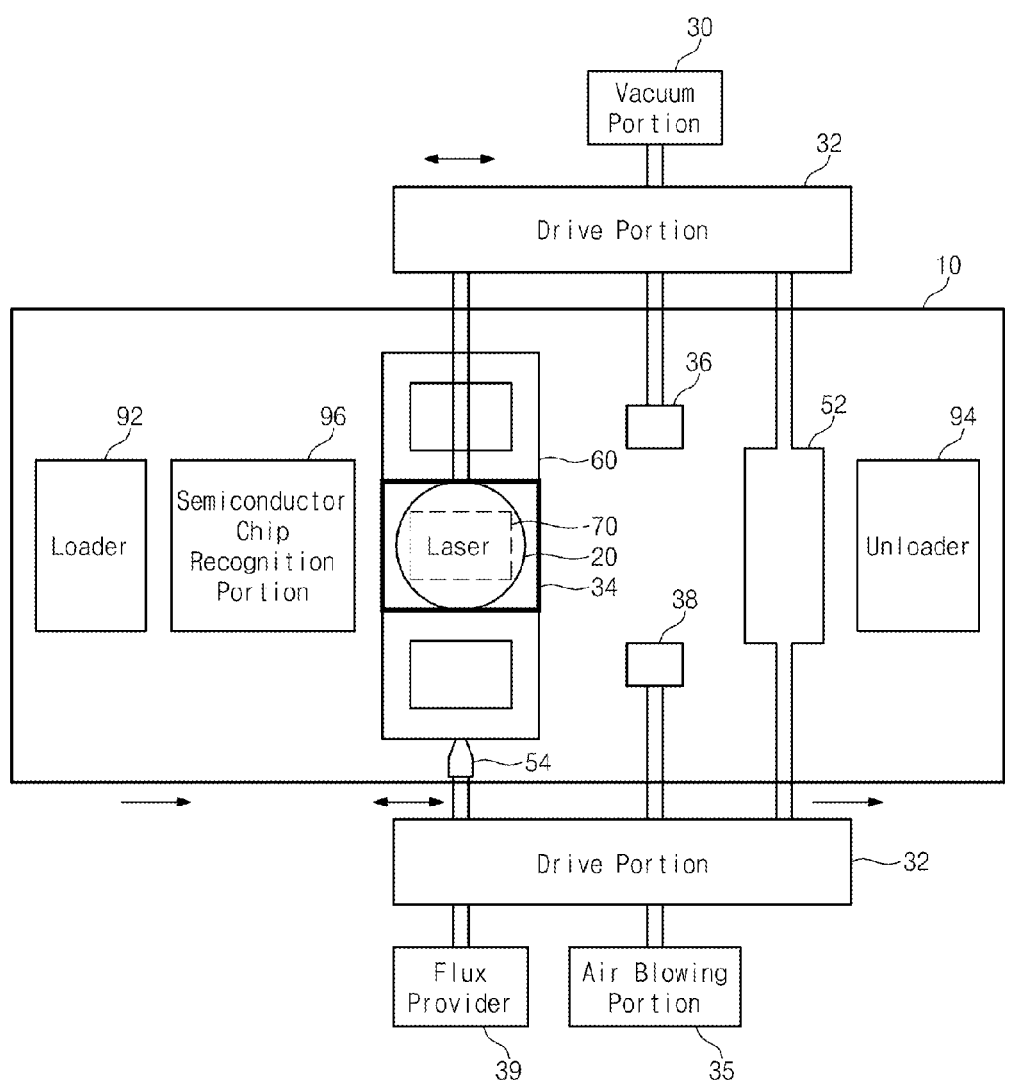
FIG. 1 is a top plan view illustrating a removal apparatus of semiconductor chip in accordance with some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
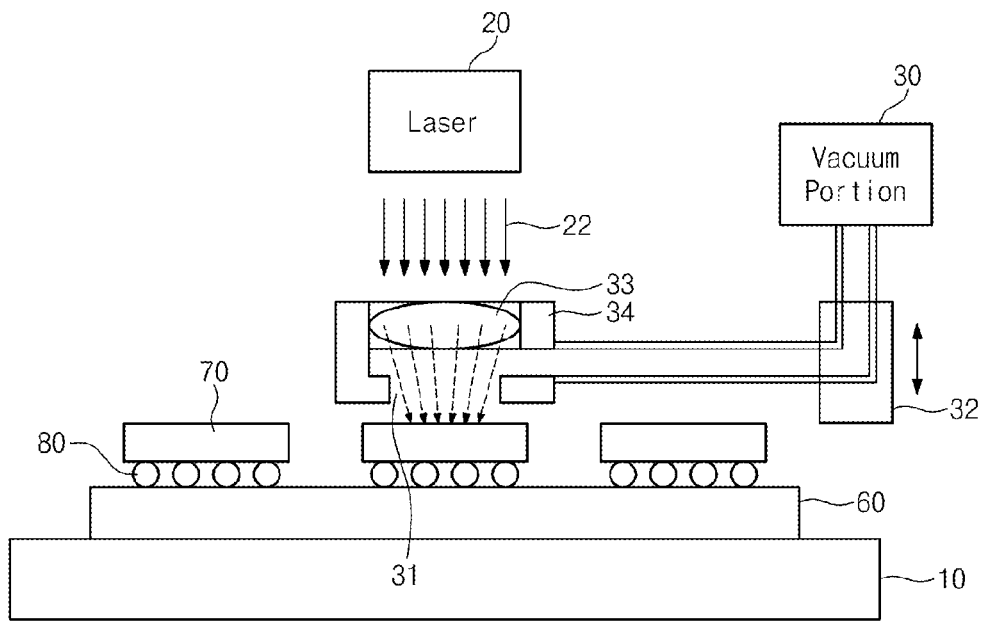
FIG. 2 is a cross-sectional view illustrating a laser and a chip picker illustrated in FIG. 1.
Figure 3:
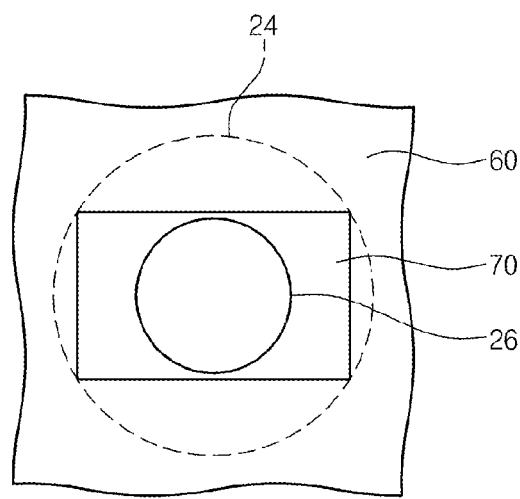
FIG. 3 is a top plan view illustrating a second exposure area of a laser beam illustrated in FIG. 2.
Figure 4:
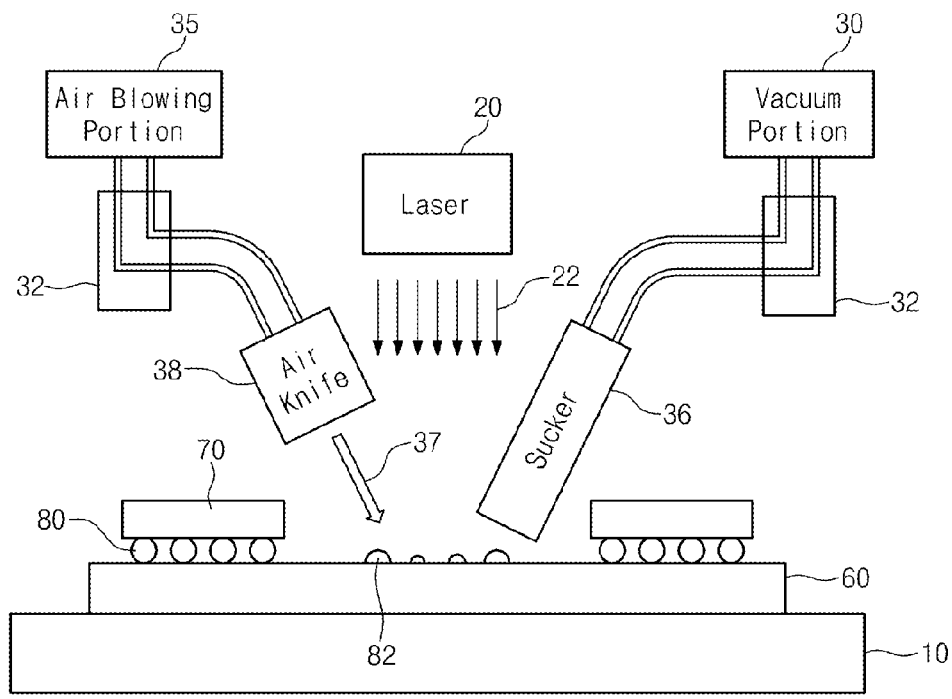
FIG. 4 is a cross-sectional view illustrating a laser and an intake illustrated in FIG. 1.
Figure 5:
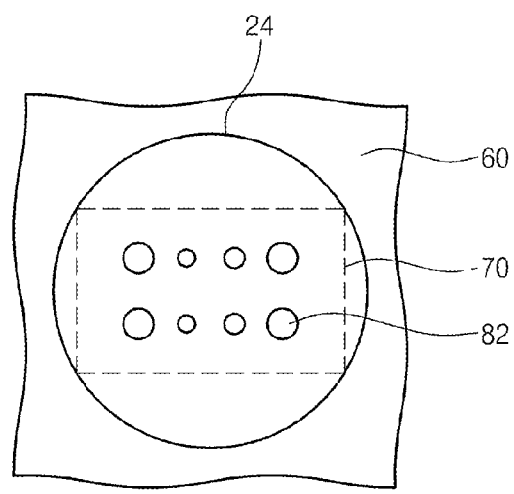
FIG. 5 is a top plan view illustrating a first exposure area of a laser beam illustrated in FIG. 4.

FIG. 1 is a top plan view illustrating a removal apparatus of semiconductor chip in accordance with some example embodiments. FIG. 2 is a cross-sectional view illustrating a laser and a chip picker illustrated in FIG. 1. FIG. 3 is a top plan view illustrating a second exposure area of a laser beam illustrated in FIG. 2. FIG. 4 is a cross-sectional view illustrating a laser and an intake illustrated in FIG. 1. FIG. 5 is a top plan view illustrating a first exposure area of a laser beam illustrated in FIG. 4.

Referring to FIGS. 1 through 5, a removal apparatus of semiconductor chip in accordance with some example embodiments of the inventive concept may heat a semiconductor chip 70 and solder pillars 82 using a laser beam 22 from a laser 20 and may melt solder bumps 80 under the semiconductor chip 70 and the solder pillars 82. The laser beam 22 may be focused on the semiconductor chip 70 by a lens 33 of a picker 34. The laser beam 22 may heat locally the semiconductor chip 70. The solder bumps 80 are melted by thermal energy of the laser beam 22. The semiconductor chip 70 may be removed from the board 60 by the picker 34. Semiconductor chip 70 may include first exposure area 24 and/or second exposure area 26.

The board 60 may be exposed to the laser beam 22. A board 60 may not be damaged by the laser beam 22 when the solder bumps 80 are melted. The board 60 may be widely heated by the laser beam 22 having smaller thermal energy density than when the laser beam 22 heats the semiconductor chip 70. Also, the thermal damage of the board 60 is minimized when the solder pillars 82 are melted by laser beam 22.

Thus, the removal apparatus of semiconductor chip in accordance with some embodiment of the inventive concept may increase or maximize productivity and production yield.

The semiconductor chips 70 may be mounted on the board in a flip chip method. The semiconductor chips 70 may include a wafer level package. The semiconductor chips 70 may include a normal semiconductor chip such as a known good die and a failed semiconductor chip. Although not illustrated in the drawing, a failed semiconductor chip may include an index such as a marking or a bar code formed on a top surface thereof. The semiconductor chip 70 separated or removed from the board 60 may be a failed semiconductor chip. The board 60 may include a printed circuit board. The solder bumps 80 may electrically connect the board 60 to the semiconductor chips 70. The solder bumps 80 may have a diameter of about 10 µm or less. The solder bumps 80 may be arrayed at intervals of several micrometers through several tens of micrometers. Although not illustrated in the drawing, an under fill may be disposed between the board 60 and the semiconductor chips 70. The under fill may electrically insulate the solder bumps 80. The under fill may fix the semiconductor chips 70 on the board 60.

The semiconductor chip 70 may be heated by thermal energy of the laser beam 22. The solder bumps 80 may be melted by heat transferred from the semiconductor chips 70. The semiconductor chip 70 may be separated from the board 60 by a picker 34 after the solder bumps 80 are melted. The solder pillars 82 may include a part of the solder bumps 80 remaining on the board 60 after the semiconductor chip 70 is removed. The solder pillars 82 may be melted by thermal energy of the laser beam 22.

A stage 10 may support the board 60 horizontally. The stage 10 may include a conveyor or a heat block moving the board 60 along a rail or a guide. The stage 10 may move or heat the board 60 depending on a control signal of control portion (not illustrated). A loader 92 may load the board 60 on the stage 10. An unloader 94 may unload the board 60 from which all of the semiconductor chips 70 are removed. For example, the loader 92 and the unloader 94 may include a robot arm controlled by a control portion. The stage 10 may heat the board 60 to between, for example, about 200° C. and about 250° C., while moving the board 60 from under the loader 92 to under the laser 20. A semiconductor chip recognition portion 96 may recognize an index on the semiconductor chip 70. The semiconductor chip recognition portion 96 may include a camera or a bar code reader.

The picker 34 may suck the semiconductor chip 70 using a vacuum provided from a vacuum portion 30. The picker 34 may make the laser beam 22 penetrate the semiconductor chip 70. The picker 34 may include the lens 33 focusing the laser beam 22. The lens 33 may focus the laser beam 22 on a second exposure area 26 of the semiconductor chip 70. The picker 34 may have an open hole 31 having a diameter smaller than the lens 33. The semiconductor chip 70 may be drawn onto the open hole 31 by a vacuum of the vacuum portion 30. Thus, the laser beam 22 penetrating the lens 33 may enter the semiconductor chip 70 through the open hole 31. A drive portion 32 may move the picker 34 from side to side, upward and downward depending on a control signal of the control portion. The picker 34 may be moved around the board 60 by the drive portion 32 when the solder bumps 80 are melted. Thus, the semiconductor chip 70 may be detached from the board 60. The drive portion 32 may move the picker 34, an intake 36, and an air knife 38 around the stage 10.

The vacuum portion 30 may provide a vacuum to the picker 34 and the intake 36. The vacuum portion 30 may include a pump. The picker 34 and the intake 36 may be connected to the vacuum portion 30 through tubes (not illustrated). The tubes are disposed between the vacuum portion 30 and the picker 34 and between the vacuum portion 30 and the intake 36 through the drive portion 32. The vacuum portion 30 may provide vacuums having different magnitudes to the picker 34 and the intake 36. The intake 36 may suck or remove the melted solder pillars 82 using the laser beam 22. The air knife 38 may blow an air 37 heated to a high temperature to the board 60. The air 37 heated to a high temperature may shorten a melting time of the solder pillars 82. An air blowing portion 35 may provide an air having pressure higher than atmospheric pressure to the air knife 38. The air knife 38 and the intake 36 may move around the board while maintaining a specific distance.

The laser 20 may generate the laser beam 22 having a thermal energy in inverse proportion to a wavelength. For example, the laser 20 may generate the laser beam 22 having a single wavelength between, for example, about 808 nm and 1064 nm. The laser 20 may let the laser beam 22 enter the semiconductor chip 70 and the board 60 successively. The laser beam 22 may enter the board 60 of a first exposure area 24. The first exposure area 24 may correspond to an irradiation area of the laser beam 22. The first exposure area 24 may be greater than a planar area of the semiconductor chips 70. For example, the first exposure area 24 may have a line width greater than a diagonal of the semiconductor chip 70 having a rectangular shape. The laser beam 22 may be focused by the lens 33 of the picker 34. The focused laser beam 22 may enter a second exposure area 26 of the semiconductor chip 70. The second exposure area 26 may be smaller than the first exposure area 24. The second exposure area 26 may be smaller than the total planar area of the semiconductor chips 70.

The laser beam 22 may have a same thermal energy and a different thermal energy density with respect to the first exposure area 24 and the second exposure area 26. That is, the laser beam 22 entering the semiconductor chip 70 and the solder pillars 82 may have a different thermal energy from each other. The laser beam 22 may have a relatively high thermal energy density in the second exposure area 26 as compared with in the first exposure area 24. The laser beam 22 having a high thermal energy density may intensively and rapidly heat the semiconductor chip 70 in the second exposure area 26 when melting the solder bumps 80. The laser beam 22 having a relatively low thermal energy density may heat the solder pillars 82 and the board 60 in the first exposure area 24. The solder pillars 82 of the first exposure area 24 may be melted by a thermal energy of the laser beam 22. A high temperature air blown by the air knife 38 may accelerate melting of the solder pillars 82. Damage of the board due to the laser beam 22 may be minimized because a thermal energy density of the laser beam 22 is low. The laser beam 22 may successively enter the semiconductor chip 70 and the solder pillars 82. Thus a removal apparatus of semiconductor chip in accordance with some embodiments of the inventive concept may shorten a time of removing the semiconductor chip 70 and the solder pillars 82.

Figure 6:
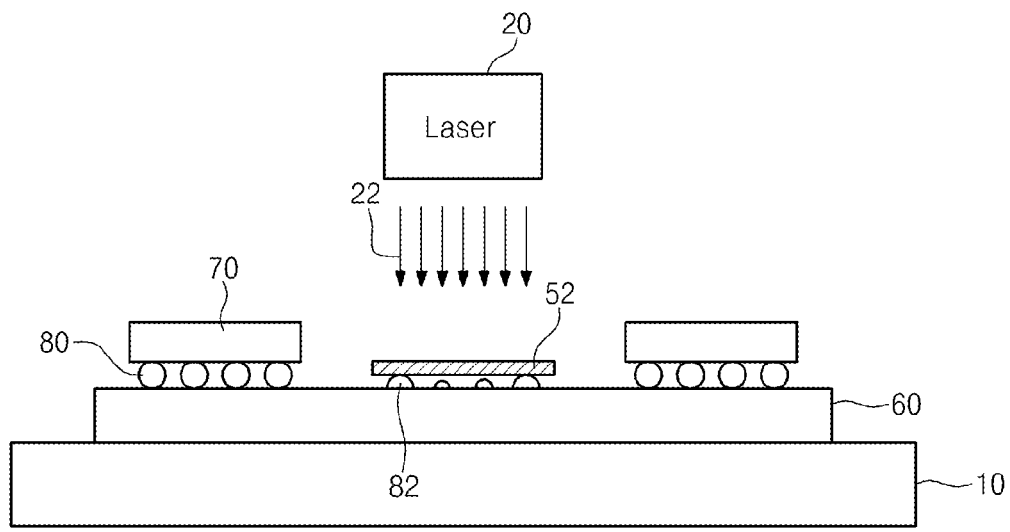
FIG. 6 is a cross-sectional view illustrating a laser and a coining unit illustrated in FIG. 1.

FIG. 6 is a cross-sectional view illustrating a laser and a coining unit illustrated in FIG. 1.

Referring to FIGS. 1 and 6, a removal apparatus of semiconductor chip in accordance with some embodiments of the inventive concept may include a coining plate 52 compressing the solder pillars 82 into the board 60. The coining plate 52 may be moved between the laser 20 and the solder pillars 82 by the drive portion 32. The drive portion 32 may move the coining plate 52 upwardly and downwardly near the board 60. The coining plate 52 may be heated by the laser beam 22. The coining plate 52 may increase a surface area of the solder pillar 82 in the first exposure area 24. When a surface area of the solder pillars 82 becomes wide, the solder pillars 82 may rapidly be melted by the laser beam 22.

Figure 7:
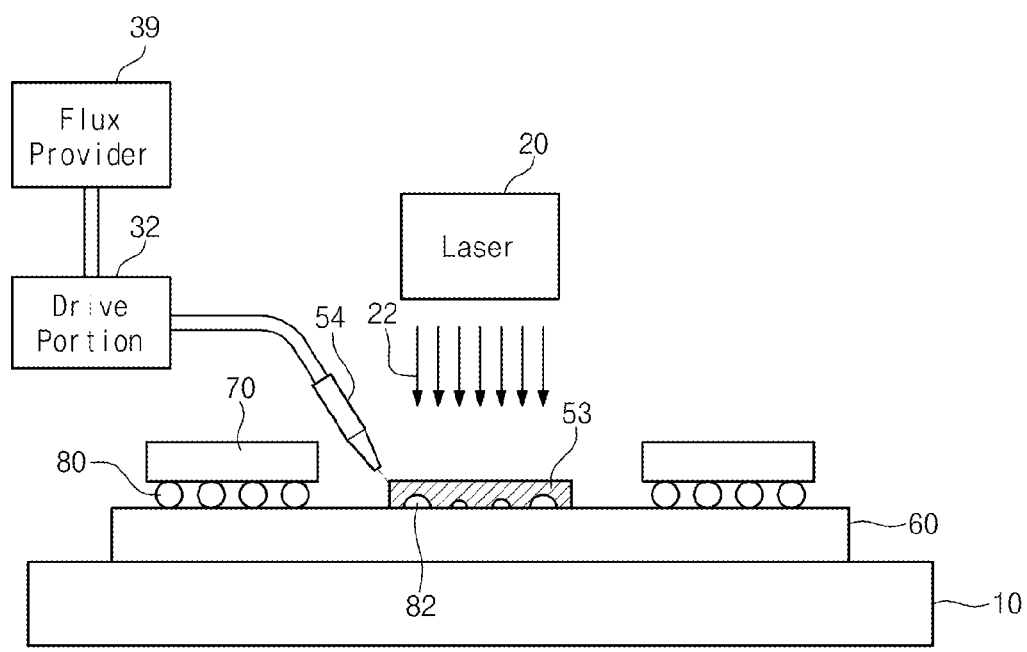
FIG. 7 is a cross-sectional view illustrating a laser and a flux nozzle illustrated in FIG. 1.

FIG. 7 is a cross-sectional view illustrating a laser and a flux nozzle illustrated in FIG. 1.

Referring to FIGS. 1 and 7, a flux 53 may accelerate melting of the solder pillars 82 by the laser beam 22. The flux 53 may be spread on the solder pillars 82 by a nozzle 54 from flux provider 36 via drive portion 32. The nozzle 54 may be moved around the stage 10 by the drive portion 32. The flux 53 may cover a part or an entire part of the first exposure area 24 of the board 60. The flux 53 may be heated by obtaining a thermal energy from the laser beam 22 of the first exposure area 24. The flux 53 may increase a thermal energy transfer of the laser beam 22 to the solder pillars 82. The flux 53 may help the solder pillars 82 to be heated by the laser beam 22. The flux 53 can minimize damage of the board 60 when the solder pillars 82 are melted.

Thus, the removal apparatus of semiconductor chip in accordance with some embodiment of the inventive concept may increase or maximize productivity and production yield.

A method of driving a removal apparatus of semiconductor chip is described below.

Figure 8:
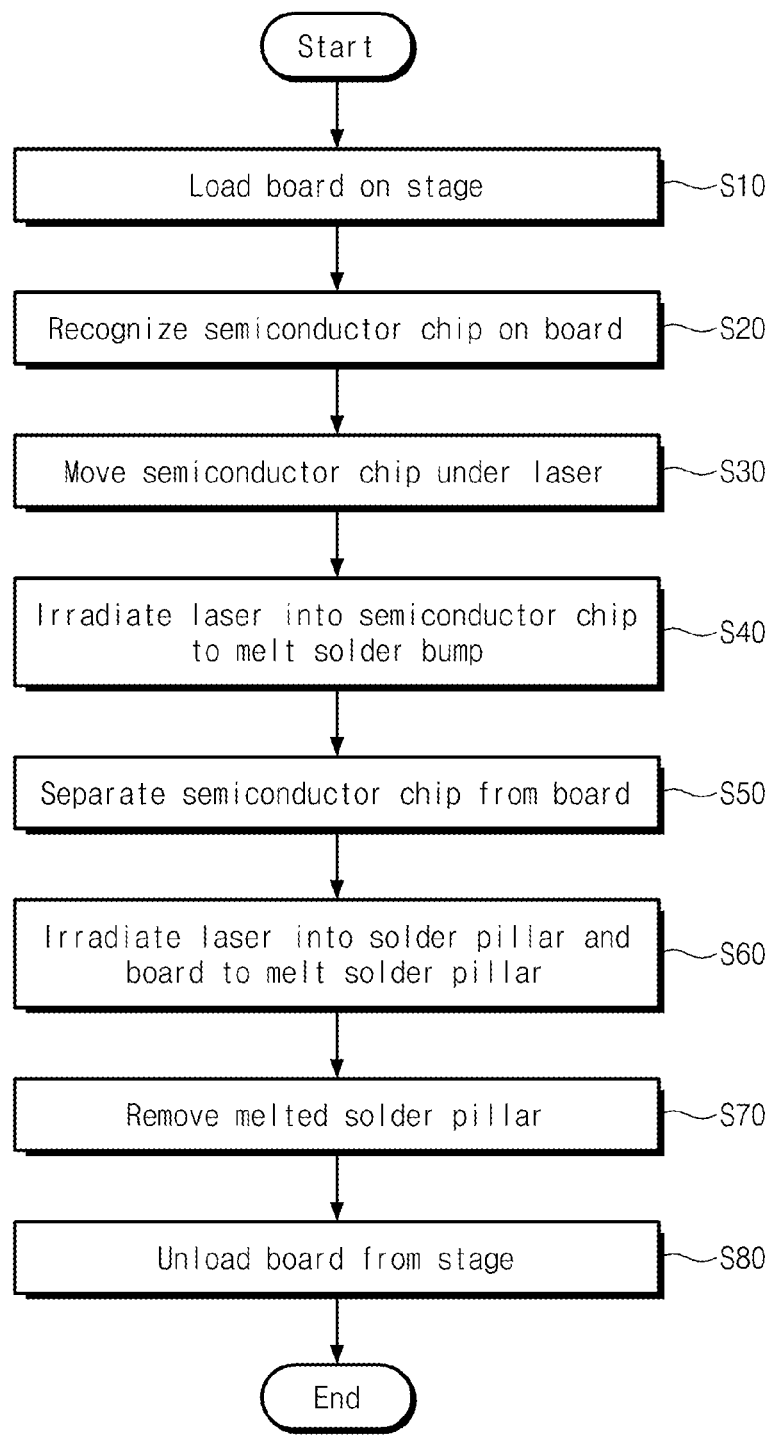
FIG. 8 is a flow chart illustrating a method of removing a semiconductor chip in accordance with some example embodiments.

FIG. 8 is a flow chart illustrating a method of removing a semiconductor chip in accordance with some example embodiments.

Referring to FIGS. 1 and 8, a loader 92 loads the board 60 on the stage 10 (S10). At least one failed semiconductor chip 70 is mounted on the board 60. The semiconductor chip 70 may include a wafer level package and may be mounted on the board 60 in a flip chip method. The semiconductor chip 70 may have an index (not illustrated) judged to be faulty in an installation test. The stage 10 may move the board 60 under a semiconductor chip recognition portion 96.

The semiconductor chip recognition portion 96 recognizes the semiconductor chip 70 on the board 60 (S20). The semiconductor chip recognition portion 96 may detect an index on the semiconductor chip 70. The semiconductor chip recognition portion 96 may include a camera obtaining an image of the semiconductor chip 70 and a bar code reader scanning a top surface of the board 60.

The stage 10 moves the semiconductor chip 70 under the laser 20 (S30). The drive portion 32 move the picker 34 between the laser 20 and the semiconductor chip 70. The lens 33 of the picker 34 may be disposed between the laser 20 and the semiconductor chip 70.

After that, the laser 20 irradiates the laser beam 22 into the semiconductor chip 70 to melt the solder bump 80 (S40). The laser beam 22 may be focused on the semiconductor chip 70 in the lens 33 of the picker 34 to enter the second exposure area 26 of the semiconductor chip 70. The semiconductor chip 70 may be locally heated by the laser beam 22. Also, the solder bumps 80 may be melted by obtaining a thermal energy from the semiconductor chip 70.

The picker 34 separates the semiconductor chip 70 from the board 60 (S50). The picker 34 may draw the semiconductor chip 70 using a vacuum provided from the vacuum portion 30. The drive portion 32 may move the picker 34 upwardly and downwardly. The picker 34 may separate or remove the semiconductor chip 70 from the board within two seconds after the laser beam 22 is irradiated.

The laser 20 irradiates the laser beam 22 into the first exposure area 24 of the board 60 successively until the solder pillars 82 are melted (S60). The air knife 38 may blow a high temperature air to the solder pillar 82. The high temperature air may shorten a melting time of the solder pillars 82. The coining plate 52 may compress the solder pillars 82. The coining plate 52 may be heated by a thermal energy of the laser beam 22. The coining plate 52 may compress the solder pillars 82 to increase a surface area of the solder pillar 82. The solder pillars 82 may be rapidly melted by obtaining a thermal energy of the laser beam 22 in proportion to a surface area of the solder pillar 82. The nozzle 54 may spread the flux 53 on the solder pillars 82. The flux 53 may effectively transfer a thermal energy of the laser beam 22 entering the first exposure area 24 to the solder pillars 82.

Thus, the method of removing a removal apparatus of semiconductor chip in accordance with some embodiment of the inventive concept may increase or maximize productivity and production yield.

The intake 36 removes the melted solder pillar 82 (S70). The intake 36 may remove the solder pillars 82 from the board 60 within five seconds after the semiconductor chip 70 is removed.

An unloader 94 unloads the board 60 from the stage 10 (S80).

Thus, the method of removing a semiconductor chip in accordance with some embodiments of the inventive concept may minimize damage of the board 60 while irradiating the laser beam 22 into the semiconductor chip 70 and the solder pillars 82 successively.

As described above, when separating a semiconductor chip from a board, a thermal damage of the board may be minimized by focusing a laser beam on the semiconductor chip. Also, even after separating the semiconductor chip from the board, the laser beam may be continuously irradiated to melt solder pillars remaining on the board. Thus, a removal apparatus of semiconductor chip and a method of removing a semiconductor chip in accordance with some embodiments of the inventive concept may maximize or increase productivity and production yield.

While example embodiments have been particularly shown and described, it will be understood by those of ordinary skill in the art that various changes in form and details may be made therein without departing from the spirit and scope of the present invention as defined by the following claims.

What is claimed is:

1. An apparatus for removing a semiconductor chip from a board, the apparatus comprising:
   a laser configured to irradiate the board with a laser beam to heat bumps mounting the semiconductor chip on the board;
   a picker configured to separate the semiconductor chip from the board, the picker being disposed between the laser and the semiconductor chip;
   a vacuum portion configured to provide a vacuum to the picker; and
   an intake,
   wherein the picker includes a lens configured to focus the laser beam on the semiconductor chip,
   wherein the picker has an open hole through which the laser beam passes and which allows the semiconductor chip to be drawn by the vacuum provided from the vacuum portion, and
   wherein if solder pillars, that are residues of the bumps, are melted by the laser beam, the intake removes the solder pillars using the vacuum provided from the vacuum portion.

2. The apparatus of claim 1, wherein the laser beam irradiates the board over an area of the board that is larger than the semiconductor chip.

3. The apparatus of claim 1, wherein the picker defines an open hole configured to draw the semiconductor chip using the vacuum provided from the vacuum portion.

4. The apparatus of claim 1, wherein the lens is further configured to focus the laser beam on an area of the board that is smaller than the semiconductor chip.

5. The apparatus of claim 1, wherein the lens is further configured to focus the laser beam to heat the bumps mounting the semiconductor chip on the board.

6. The apparatus of claim 1,
wherein the lens is further configured to focus the laser beam to heat the bumps mounting the semiconductor chip on the board.

* * * * *